United States Patent
Aslan et al.

(10) Patent No.: US 6,774,676 B1
(45) Date of Patent: Aug. 10, 2004

(54) DUAL THRESHOLD BUFFER WITH HYSTERESIS

(75) Inventors: Mehmet Aslan, Milpitas, CA (US); Qing Feng Ren, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/374,578

(22) Filed: Feb. 24, 2003

(51) Int. Cl.[7] .................. H03K 19/0175; H03K 19/094; H03K 5/153; H03K 5/22
(52) U.S. Cl. ..................... 326/83; 327/74; 327/206
(58) Field of Search ............................ 326/83, 34, 36, 326/65, 22, 23; 327/100, 205, 206, 74; 341/56

(56) References Cited

U.S. PATENT DOCUMENTS

| | | | | |
|---|---|---|---|---|
| 4,453,094 A | * | 6/1984 | Peil et al. ...................... | 326/36 |
| 5,237,213 A | * | 8/1993 | Tanoi ............................ | 327/205 |
| 5,256,916 A | * | 10/1993 | Thurston ...................... | 326/65 |
| 5,631,585 A | * | 5/1997 | Kinoshita et al. ............ | 327/100 |
| 6,023,174 A | * | 2/2000 | Kirsch .......................... | 326/34 |
| 6,084,433 A | * | 7/2000 | Momtaz ........................ | 326/83 |

OTHER PUBLICATIONS

R. Jacob Baker et al., "CMOS Circuit Design, Layout, and Simulation", *IEEE Press Series on Microelectronic Systems*, p. 357, 1998.

* cited by examiner

*Primary Examiner*—Patrick Wamsley
(74) *Attorney, Agent, or Firm*—Mark R. Hennings; Merchant & Gould

(57) ABSTRACT

The present invention is directed to a buffer having dual thresholds. The buffer has an input terminal and an output terminal and comprises a current source, first through fourth transistors, a current mirror, and an output driver. The buffer uses an "analog" topology to achieve accurate buffering when the thresholds of applied signals are not centered about the mid-supply range. The buffer is useful (among other circuits) in analog and mixed circuit integrated circuits that have relatively high voltage supply levels and signals having logic thresholds that are not centered about the mid-supply level. The buffer uses feedback from the output to achieve hysteresis.

19 Claims, 6 Drawing Sheets

DUAL THRESHOLD BUFFER WITH HYSTERESIS

FIELD OF THE INVENTION

The present invention relates generally to buffers, and more particularly to buffers having dual thresholds.

BACKGROUND OF THE INVENTION

Signal transmission busses may use discrete voltage levels to convey digital information. Many transmission busses convey digital information using "high" and "low" voltage levels. The high and low voltage levels can be any useful voltage levels and are not necessarily centered about a mid-supply voltage. Oftentimes, analog or mixed signal integrated circuits use relatively higher voltage supply levels, which may require detecting threshold values that are not centered about a mid-supply voltage. For example, GTL logic threshold levels are typically 0.4V for a "low" logical input, and 0.8V for a "high" logical input. In circuits where the voltage supply level (e.g. Vcc) is 3.3V for an integrated circuit, the GTL logic threshold levels are not centered about the mid supply voltage (i.e., 1.65V).

SUMMARY OF THE INVENTION

The present invention is directed to a buffer having dual thresholds. According to one aspect of the invention, a buffer having an input terminal and an output terminal comprises a current source, first through fourth transistors, a current mirror, and an output driver. The first current source is configured to produce an overall current. The first transistor is configured to produce a first current in response to a first threshold voltage. The second transistor is configured to produce a second current in response to a second threshold voltage when the output of the buffer is equivalent to a first logic state. The third transistor is configured to produce a third current in response to a voltage at the input terminal. The fourth transistor is configured to produce a fourth current in response to the voltage at the input terminal when the output of the buffer is equivalent to the first logic state. The current mirror is configured to receive the first and second currents to produce a first grouped current at a first node, receive the third and fourth currents to produce a second grouped current at a second node, and reflect a selected one of the first and second grouped currents to produce a reflected current at a selected one of the first and second nodes, such that a voltage is produced at the selected node in response to the reflected current and the grouped current that is not reflected. The output driver is configured to produce an output voltage at the output terminal in response to the voltage produced at the selected node.

According to another aspect of the invention, a method for providing buffering with hysteresis for an input signal comprises producing a first current in response to a first threshold voltage. The second current is produced in response to a second threshold voltage when the output of the buffer is equivalent to a first logic state. A third current is produced in response to a voltage at the input terminal. The fourth current is produced in response to the voltage at the input terminal when the output of the buffer is equivalent to the first logic state. The first and second currents are received at a first node such that a first grouped current is produced. The third and fourth currents are applied to a second node such that a second grouped current is produced. A selected one of the first and second grouped currents is mirrored to produce a reflected current at a selected one of the first and second nodes whereby a voltage is produced in response to the reflected current and the grouped current that is not reflected. An output voltage is produced for the buffer in response to the voltage produced at the selected node.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
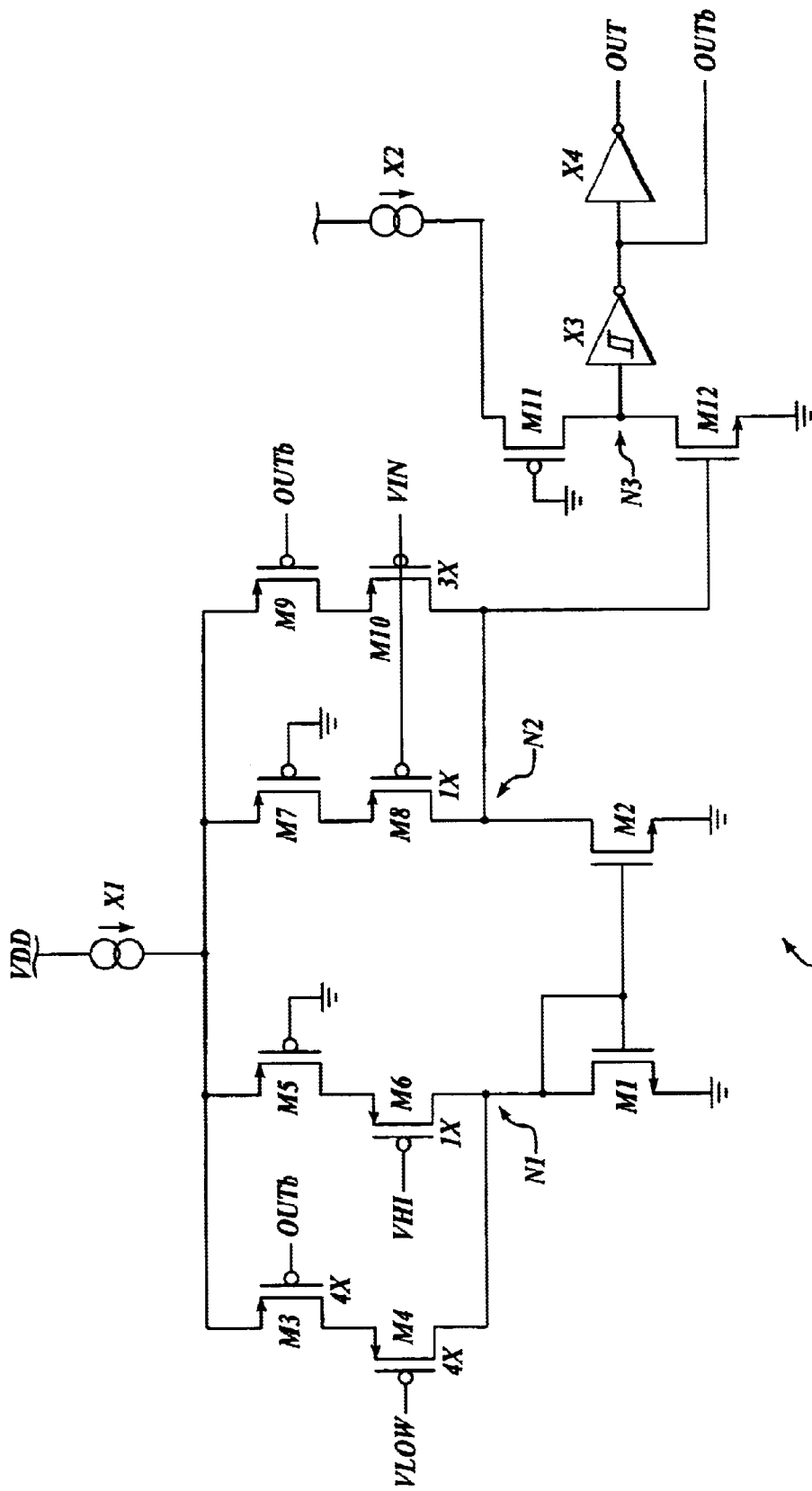
FIG. 1 is an overview schematic of a dual threshold buffer with hysteresis in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed to a buffer having dual thresholds. The buffer has an input terminal and an output terminal and comprises a current source, first through fourth transistors, a current mirror, and an output driver. The buffer uses an "analog" topology to achieve accurate buffering when the thresholds of applied signals are not centered about the mid-supply range. The buffer is useful (among other circuits) in analog and mixed circuit integrated circuits that have relatively high voltage supply levels and signals having logic thresholds that are not centered about the mid-supply level. The buffer uses feedback from the output to achieve hysteresis.

FIG. 1 is an overview schematic of a dual threshold buffer with hysteresis in accordance with the present invention. Example buffer 100 is suited for buffering logic signals having thresholds that are below the mid-supply range. As shown in the figure, example buffer 100 comprises transistors M1–M12, current sources X1–X2, and inverters X3–X4. In other embodiments, transistors M5, M7, and M11 may be omitted. Transistor M11 may alternatively be incorporated within current source X2. Current source X2 can be omitted if transistor M11 is present. Inverter X3 is preferably a buffer such as a Schmidt triggered buffer, although other types of buffers can be used. Transistors M3, M5, M7, and M9 may be configured as switches.

Current source X1 is arranged to provide a current to a comparator-like topology. Current source X1 potentially provides current through four paths, with two paths flowing through node N1 and two paths flowing through node N2. Each of the four paths conducts current in response to control signals. The voltage produced at node N2 determines the logic state of the output of buffer 100.

The control signals include a VIN signal, a OUTb signal, a VLOW signal reference, and a VHI signal reference. The VIN signal is an input signal that is provided to the input of buffer 100. The OUTb signal reflects the inverse of buffer 100 output logic status, which is used to provide hysteresis for buffer 100. The VLOW signal specifics the voltage at which the output of buffer 100 will transition from a high to a low in response to a decrease in VIN. The VHI signal specifies the voltage at which the output of buffer 100 will transition from a low to a high in response to an increase in VIN.

Reference VHI is coupled to the control terminal of transistor M6. Transistor M6 and switch M5 are arranged to provide a first current. Switch M5 provides a current path from current source X1 to the source of transistor M6 and is arranged to be continually "on." Switch M5 is provided for balancing purposes and may be omitted. Transistor M6 conducts such that the first current is produced in response to reference VHI.

Reference VLOW is coupled to the control terminal of transistor M4. Transistor M4 and switch M3 are arranged to produce a second current when switch M3 is closed. Switch M3 is arranged to conduct when OUTb is low (as generated by inverter X3, described below). Transistor M4 is typically sized to be four times larger than transistor M6, which presents a resistance in transistor M6 that is about a fourth of the resistance of transistor M6. (The ratio between transistor sizes typically decreases as the difference between references VHI and VLOW increases.) When OUTB is low, current provided by current source X1 sources the first and second currents such that the second current (which flows through transistor M4 when switch M3 is closed) is substantially larger than the first current (which flows through transistor M6) such that the first current is negligible. When node OUTb is high, transistor M4 does not carry current produced by current source X1.

Transistors M1 and M2 are arranged as a current mirror, which mirrors the current flowing through node N1 at node N2. Accordingly, the first current is reflected in node N2 when OUTb is high, and the sum of the first and second currents is reflected in node N2 when OUTb is low (although the first current is negligible as a result of the selected size ratio of transistor M6 to transistor M4).

Input signal VIN is coupled to the control terminal of transistor M8. Transistor M8 and switch M7 are arranged to provide a third current. Switch M7 provides a current path from current source X1 to source of transistor M8 and is arranged to be continually on. Switch M7 is provided for balancing purposes and may be omitted. Transistor M8 is arranged to produce a third current in response to the level of the input (VIN) to buffer 100. Transistor M8 is typically similar in size to transistor M6 such that the third current is typically similar in size to the first current when VIN is equal to VHI and OUTb is high.

Input signal VIN is also coupled to the control terminal of transistor M10. Transistor M10 and switch M9 are arranged to produce a fourth current when switch M9 is closed. Switch M9 is arranged to conduct when OUTb is low. Transistor M10 is typically sized such that the combined size of transistor M8 and transistor M10 is substantially equal to the size of transistor M4.

When OUTB is low, current provided by current source X1 sources the third and fourth currents such that the fourth current (which flows through transistor M4 when switch M3 is closed) is larger than the third current (which flows through transistor M6). When node OUTb is high, transistor M10 does not carry current produced by current source X1. The third current and the fourth current, if present, are applied to node N2. A voltage is produced at node N2 in response to the reflected current and the sum of the third and fourth currents.

Accordingly, the voltage that is produced at node N2 is determined by signals VHI, VLOW, OUTb, and VIN. Signal OUTb represents the (inverted) logic state of the "previous" logic value output by buffer 100. When signal OUTb is high, the second and fourth currents are not produced. (In this example the first and third currents are produced irrespectively of the logical status of OUTb.) VIN (which is related to the third current) is compared against VHI (which is related to the first current) such that a voltage is produced at node N2. Thus, a higher voltage threshold (i.e., VHI) is used when the output of the buffer is low (and OUTb is high) such that the VHI is used as the voltage threshold when VIN transitions from low to high.

When signal OUTb is low, current from current source X1 is divided to so that the four currents are produced. The first current is assumed to be negligible due to the sizing of transistor M6 (as discussed above). VIN (which is related to the sum of the third and fourth currents) is compared against VLOW (which is related to the second current) such that a voltage is produced at node N2. Thus, a lower voltage threshold (i.e., VLOW) is used when the output of the buffer is high (and OUTb is low) such that the VLOW is used as the voltage threshold when VIN transitions from high to low. The transfer function of buffer 100 is further discussed below with respect to FIG. 2.

The control terminal of transistor M12 is coupled to node N2. Transistors M11 and M12 are arranged as an inverter such that the voltage of node N2 is logically inverted at node N3. Current source X2 is typically clamped to reduce current flow that occurs when both transistors M11 and M12 are conducting.

Node N3 is coupled to the input of inverter X4. A Schmidt trigger buffer is typically used to provide noise immunity and prevent false triggering that may result from electrical noise that is present at node N3. Inverter X4 provides an output voltage at node OUT in response to the voltage at node N3.

When the voltage of signal OUT is high, the voltage of signal OUTb is correspondingly low. As discussed above, OUTb actuates switches M3 and M9 such that a different voltage threshold is used for VIN depending on the status of the output of buffer 100.

Figure 2:
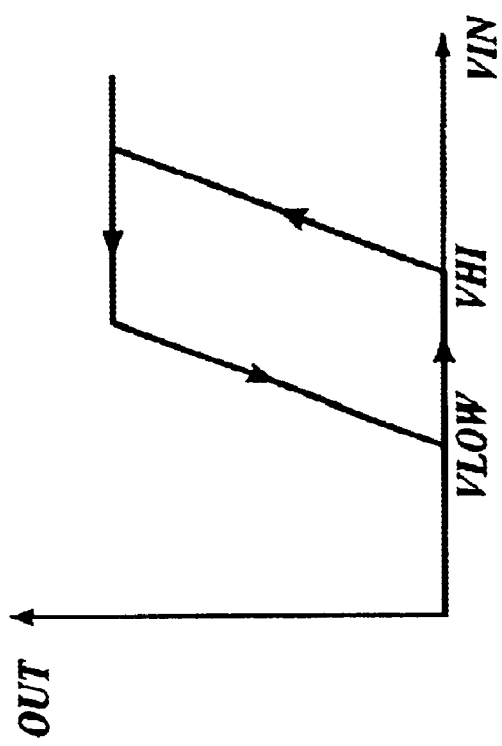
FIG. 2 is a graph showing an example transfer function of a dual threshold buffer with hysteresis in accordance with the present invention.

FIG. 2 is a graph showing an example transfer function of a dual threshold buffer with hysteresis in accordance with the present invention. A first voltage reference (VLOW) provides a first threshold value, while a second voltage reference (VHI) provides a second threshold value that is higher than the first threshold value. As shown in the figure, the output (that is at node OUT) of buffer 100 rises in response to the input voltage (at node VIN) rising above the second threshold value. The output of buffer 100 falls in response to the input voltage falling below the second threshold value.

Figure 3:
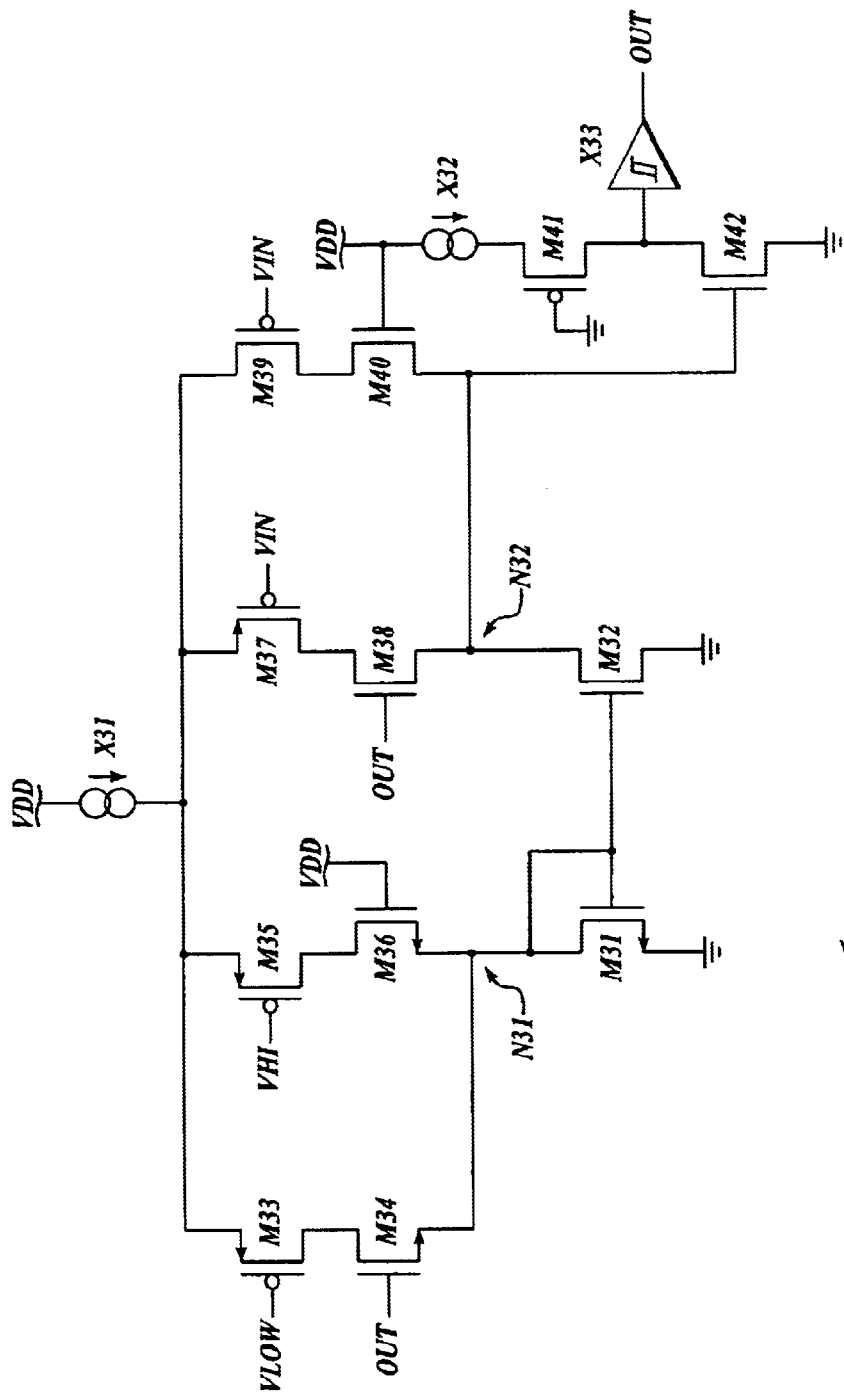
FIG. 3 is an overview schematic of an alternative dual threshold buffer with hysteresis in accordance with the present invention.

FIG. 3 is an overview schematic of a dual threshold buffer with hysteresis in accordance with the present invention. As shown in the figure, example buffer 300 comprises transistors M31–M42, current sources X31–X32, and buffer X33. In various embodiments, transistors M36, M40, and M41 may be omitted. Transistor M41 may alternatively he incorporated within current source X32. Buffer X33 is typically a Schmidt triggered buffer, although other types of buffers can be used. Transistors M34, M36, M38, and M40 may be configured as switches.

Buffer 300 operates in a similar fashion to buffer 100, although buffer 300 also has a greater offset than buffer 100. The greater offset results from the voltages at node N31 and N32 not being equal at the time of switching, which causes transistors M34 and M38 to switch at different times.

Figure 4:
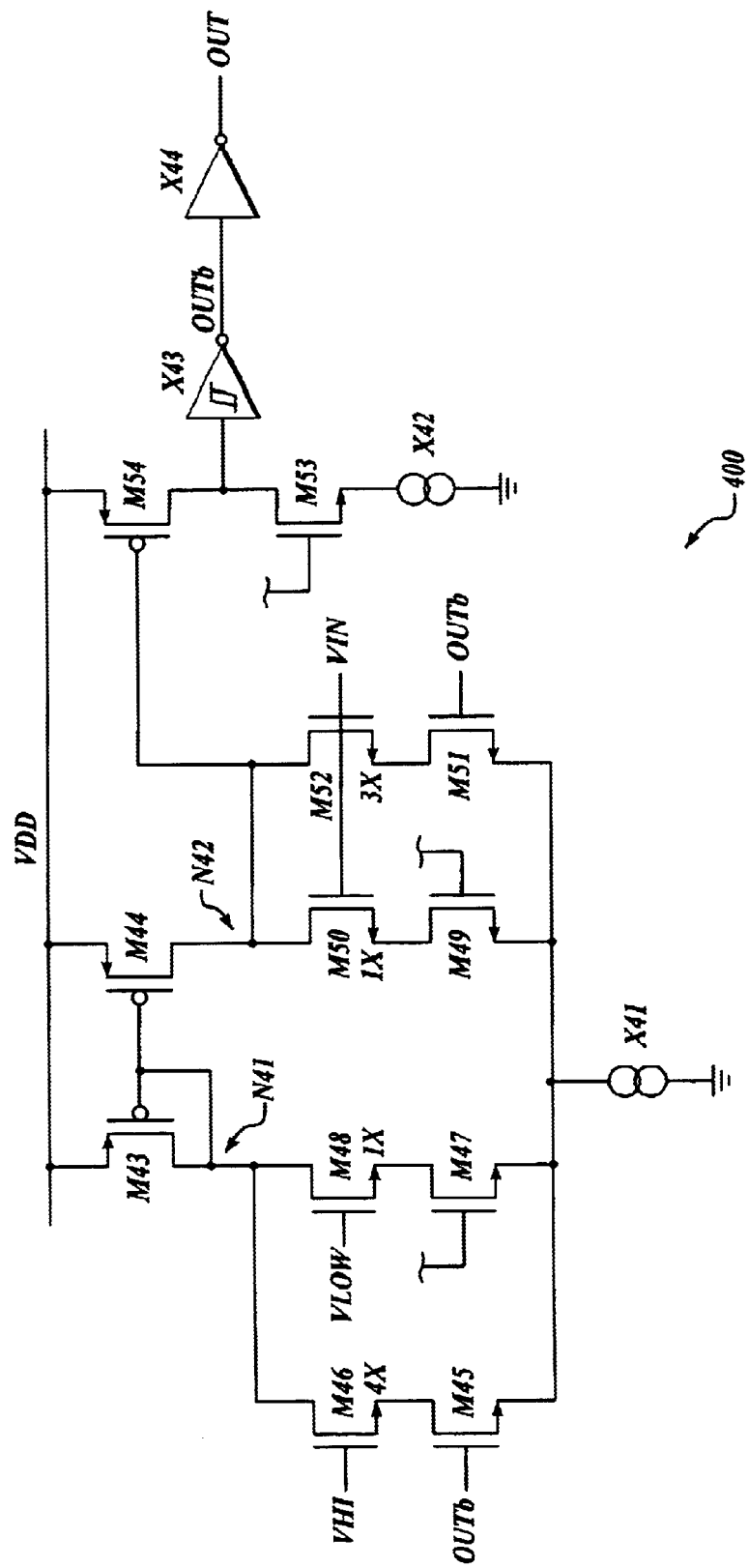
FIG. 4 is an overview schematic of another alternative dual threshold buffer with hysteresis in accordance with the present invention.

FIG. 4 is an overview schematic of another alternative dual threshold buffer with hysteresis in accordance with the present invention. As shown in the figure, example buffer 400 comprises transistors M43–M54, current sources X41–X42, and buffers X43–X44. In various embodiments, transistors M47 and M49 may be omitted. Additionally, either transistor M43 or current source X43 may be omitted. Buffer X43 is typically a Schmidt triggered buffer, although other types of buffers can be used. Transistors M45, M47, M49, and M51 may be configured as switches.

Buffer 400 operates in a similar fashion to buffer 100, except that buffer 400 is more suited towards signals having logic thresholds that are higher than the mid-supply voltage level. Transistor M46 operates in response to signal VHI, whereas transistor M48 operates in response to signal VLOW.

Figure 5:
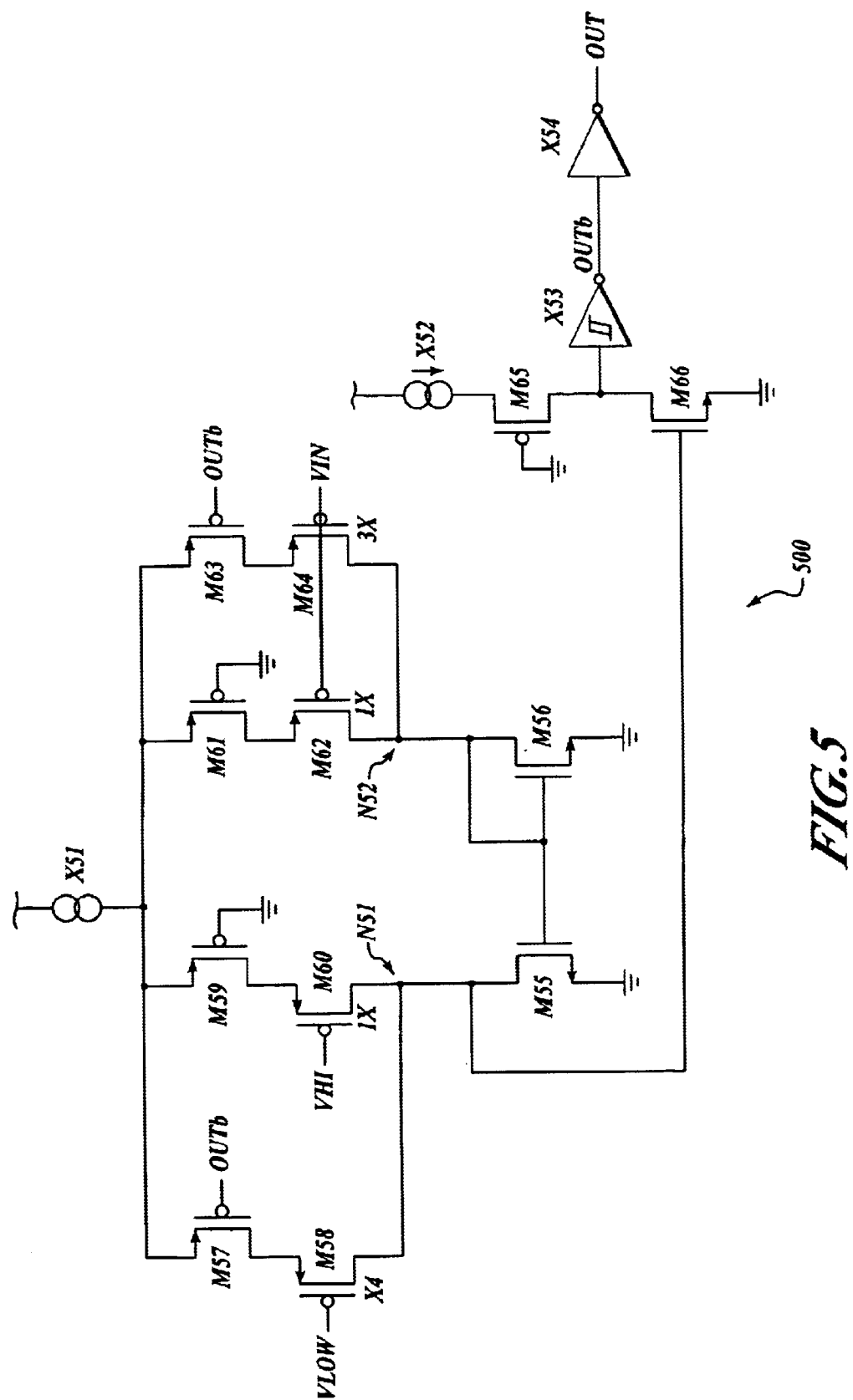
FIG. 5 is an overview schematic of yet another alternative dual threshold buffer with hysteresis in accordance with the present invention.

FIG. 5 is an overview schematic of yet another alternative dual threshold buffer with hysteresis in accordance with the present invention. As shown in the figure, example buffer 500 comprises transistors M55–M66, current sources X51–X52, and buffers X53–X54. In various embodiments, transistors M59 and M61 may be omitted. Additionally, either transistor M65 or current source X53 may be omitted. Buffer X53 is typically a Schmidt triggered buffer, although other types of buffers can be used. Transistors M57, M59, M61, and M63 may be configured as switches.

Buffer 500 operates in a similar fashion to buffer 100, except that buffer 500 comprises a current mirror (see transistors M55 and M56) that is configured "backwards" relative to the current mirror of buffer 100. The current mirror of buffer 500 is configured to receive first and second currents at node N51 and to receive third and fourth currents at node N52. The third and fourth currents are reflected by the current mirror at node N51, which is an output node (as compared to node N1 of FIG. 1, which is an input node). An output voltage is produced at node N51 in response to the reflected current and the first and second currents (which are not reflected).

Figure 6:
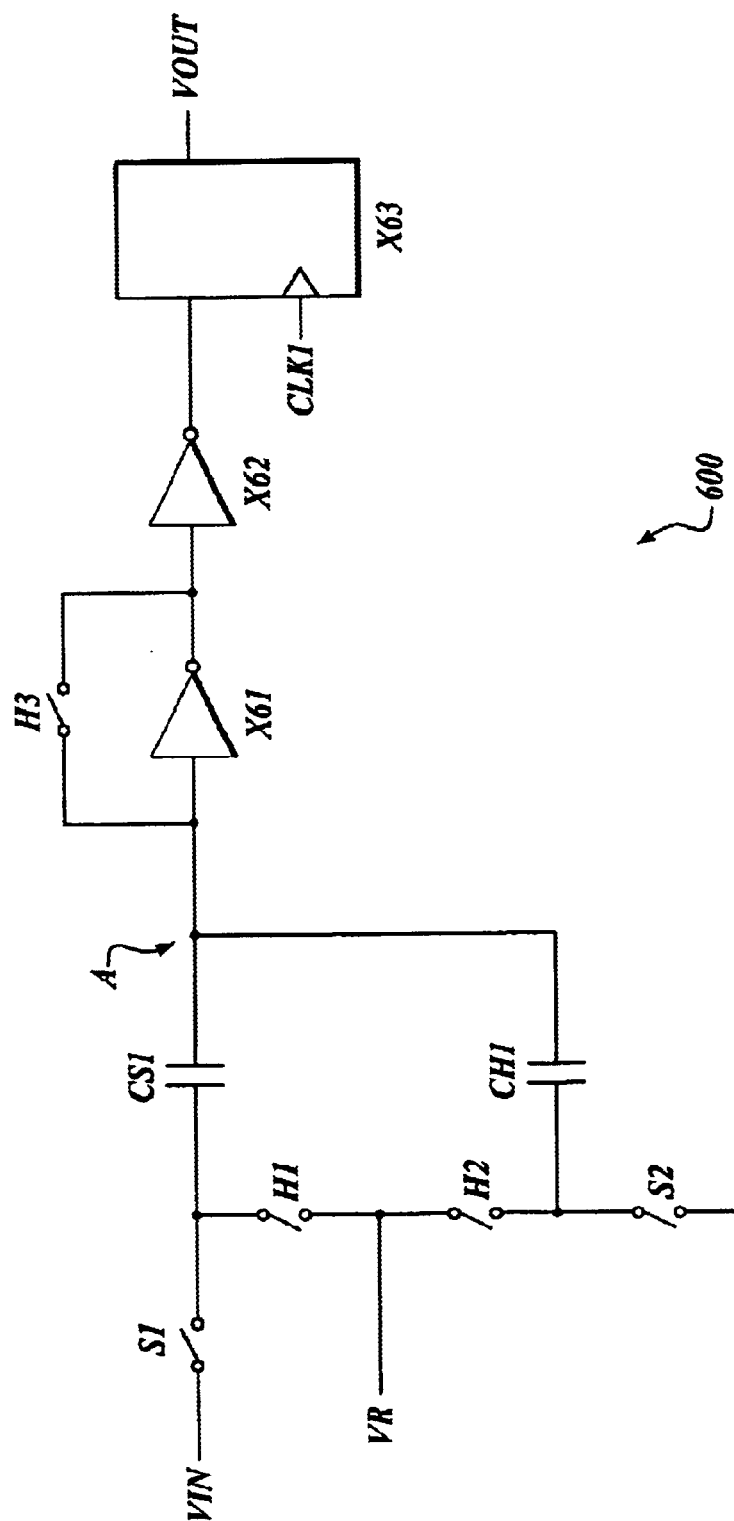
FIG. 6 is an overview schematic of a switched capacitor dual threshold buffer with hysteresis in accordance with the present invention.

FIG. 6 is an overview schematic of a switched capacitor dual threshold buffer with hysteresis in accordance with the present invention. As shown in the figure, example buffer 600 comprises switches H1–H3 and S1–S2, capacitors CS1 and CH1, inverters X61–X62 and latch X63. Inverter X61 is typically a clamped current buffer. Switches H1–H3 and S1–S2 are switching circuits (such as transistors) that are suitable for opening and closing circuits in response to a control signal.

Signal CLK1 is a clock signal from which a first phase and a second phase are derived for controlling the switches. For simplicity, switching circuits designated with an initial "H" are assumed in the discussion to be closed during the first phase and open during the second phase. Likewise, switching circuits designated with an initial "S" are assumed the discussion to be open during the first phase and closed during the second phase.

During the first phase (when switches H1–H3 are closed), capacitors CS1 and CH1 obtain a voltage that is equal to VR−VTH. VR is a voltage reference that is used to determine logic voltage thresholds for the input signal VIN. VTH is the voltage that is obtained at node A (when switch H3 is closed).

During the second phase, capacitor CS1 is coupled to VIN, and capacitor CH1 is coupled to VFB. VIN is the input signal to buffer 600, which is to be buffered using hysteresis. VFB is a signal that is generated in response to the logic state of VOUT, which is latched by latch X63. VFB is set equal to VR when VOUT has a logic state of "1," and VFB is set equal to zero volts when VOUT has a logic state of "0." Other embodiments of the invention may assign different voltage levels to the logic states.

At the end of the second phase, the voltage (VA) at node A is determined in accordance with the equation:

$$VA = VTH + (VIN - VR)\frac{CS1}{CS1+CH1} + (VFB - VR)\frac{CH1}{CS1+CH1} \quad (I)$$

Accordingly, the voltage threshold against which VIN is compared is determined (in part) by a previously latched value of VOUT. When a previously latched value of VOUT has a logic state of "1," VFB is set to VR (as discussed above). When VIN is greater than VR, VA is also greater than VTH. When VA is greater than VTH, a value of logic state "1" is produced for VOUT. When VIN is less than VR, VA is also less than VTH. When VA is less than VTH, a value of logic state "0" is produced for VOUT. The produced logic value is then newly latched by buffer X63 in response to CLK1.

When a previously latched value of VOUT has a logic state of "0,"VFB is set to zero volts (as discussed above). When VIN is greater than $$VR\left(1 + \frac{CH1}{CS1}\right),$$

VA is also greater than VTH. Because VA is greater than VTH, a value of logic state "1" is produced for VOUT. When VIN is less than $$VR\left(1 + \frac{CH1}{CS1}\right),$$

VA is also less than VTH. When VA is less than VTH, a value of logic state "0" is produced for VOUT. The produced logic value is then newly latched by buffer X63 in response to CLK1.

The above specification, examples and data provide a complete description of the manufacture and use of the composition of the invention. For example, the transistors having grounded control terminals may be omitted. Transistors M5 and M7 may optionally have their control terminals coupled to OUT such that any current is switched off when node OUT is low. Additionally, transistors M4 and M10 may be of similar sizes, with the control terminal of transistor M7 being coupled to OUT. Since many embodiments of the invention can be made without departing from the spirit and scope of the invention, the invention resides in the claims hereinafter appended.

We claim:

1. A buffer having an input terminal and an output terminal, comprising:
    a first current source for producing an overall current;
    a first transistor that is configured to produce a first current in response to a first threshold voltage, wherein the first current is sourced from the overall current;
    a second transistor that is configured to produce a second current in response to a second threshold voltage, wherein the second current is sourced from the overall current and the second current is produced when an output voltage of the buffer is in a first logic state;
    a third transistor that is configured to produce a third current in response to a voltage at the input terminal, wherein the third current is sourced from the overall current;
    a fourth transistor that is configured to produce a fourth current in response to the voltage at the input terminal, wherein the fourth current is sourced from the overall current and the fourth current is produced when the output voltage of the buffer is in the first logic state;
    a current mirror that is configured to receive the first and second currents to produce a first grouped current at a first node, receive the third and fourth currents to produce a second grouped current at a second node, and reflect a selected one of the first and second grouped currents to produce a reflected current at a selected one of the first and second nodes, such that a voltage is produced at the selected node in response to the reflected current and the grouped current that is not reflected; and
    an output driver that is configured to produce the output voltage at the output terminal in response to the voltage produced at the selected node, wherein the output voltage has at least two logic states.

2. The buffer of claim 1, wherein the second transistor is larger than the first transistor such that the second current is larger than the first current.

3. The buffer of claim 2, further comprising a fifth transistor that is coupled between the first transistor and first current source and that has a control terminal that is operable in response to the output voltage.

4. The buffer of claim 3, further comprising a fifth transistor that is coupled between the third transistor and first current source and that has a control terminal that is operable in response to the output voltage.

5. The buffer of claim 2, wherein the second transistor is substantially the same size as the combined size of the first and second transistors.

6. The buffer of claim 1, wherein the output driver comprises:
    a second current source;
    an inverter having an input that is coupled to the selected node, a supply that is coupled to the second current source, and output; and
    a logic gate having an input coupled to the output of the inverter.

7. The buffer of claim 6, wherein the input of the logic gate is Schmidt triggered.

8. The buffer of claim 1, further comprising:
    a first switch that is configured to open when the output voltage is in a second logic state such that the second current is reduced; and
    a second switch that is configured to open when the output voltage is in a second logic state such that the fourth current is substantially zero.

9. A method for providing hysteresis for an input signal, comprising:
    producing a first current in response to a first threshold voltage;
    producing a second current in response to a second threshold voltage, wherein the second current is produced when an output voltage of the buffer is in a first logic state;
    producing a third current in response to a voltage at the input terminal;
    producing a fourth current in response to the voltage at the input terminal, wherein the fourth current is produced when the output voltage of the buffer is in the first logic state;
    receiving the first and second currents at a first node such that a first grouped current is produced;
    applying the third and fourth currents to a second node such that a second grouped current is produced;
    mirroring a selected one of the first and second grouped currents to produce a reflected current at a selected one of the first and second nodes whereby a voltage is produced in response to the reflected current and the grouped current that is not reflected; and
    producing the output voltage for the buffer in response to the voltage produced at the selected node, wherein the output voltage has at least two logic states.

10. The method of claim 9, wherein the produced second current is larger than the produced first current.

11. The method of claim 10, wherein the produced first and third currents are substantially the same size.

12. The method of claim 10, wherein the produced fourth current is less than the produced second current.

13. The method of claim 9, further comprising further comprising:
    opening a first switch when the output voltage is in a second logic state such that the second current is substantially zero;
    closing the first switch when the output voltage is in a first logic state;
    opening a second switch when the output voltage is in a second logic state such that the fourth current is substantially zero; and
    closing the second switch when the output voltage is in a first logic state.

14. The method of claim 9, wherein the first, second, third, and fourth currents are sourced from a first current source.

15. A buffer having an input and an output terminal, comprising:

means for producing a first current in response to a first threshold voltage;

means for producing a second current in response to a second threshold voltage, wherein the second current is produced when an output voltage of the buffer is in a first logic state;

means for producing a third current in response to a voltage at the input terminal;

means for producing a fourth current in response to the voltage at the input terminal, wherein the fourth current is produced when the output voltage of the buffer is in the first logic state;

means for receiving the first and second currents at a first node such that a first grouped current is produced, receiving the third and fourth currents at a second node such that a second grouped current is produced, and reflecting a selected one of the first and second grouped currents to produce a reflected current at a selected one of the first and second nodes whereby a voltage is produced at the selected node in response to the reflected current and the grouped current that is not reflected; and means for producing the output voltage at the output terminal in response to the voltage produced at the selected node, wherein the output voltage has at least two logic states.

16. The buffer of claim 15, further comprising:

means for reducing the second current when the output voltage is in a second logic state; and means for reducing the fourth current when the output voltage is in a second logic state.

17. The buffer of claim 15, further comprising:

means for reducing the second current when the output voltage is in a second logic state such that the second current is substantially zero; and means for reducing the fourth current when the output voltage is in a second logic state such that the fourth current is substantially zero.

18. The buffer of claim 15, wherein the means for producing an output voltage comprises:

a second current source;

an inverter having an input that is coupled to the second node, a supply that is coupled to the second current source, and output; and a logic gate having an input coupled to the output of the inverter.

19. The buffer of claim 15, wherein the first, second, third, and fourth currents are configured to receive current from a unitary current source.

* * * * *

UNITED STATES PATENT AND TRADEMARK OFFICE
CERTIFICATE OF CORRECTION

PATENT NO.    : 6,774,676 B1
DATED         : August 10, 2004
INVENTOR(S)   : Mehmet Aslan et al.

It is certified that error appears in the above-identified patent and that said Letters Patent is hereby corrected as shown below:

Column 8,
Line 56, delete the first occurrence of "further comprising".

Signed and Sealed this

Thirty-first Day of May, 2005

JON W. DUDAS
*Director of the United States Patent and Trademark Office*